(12) United States Patent
Hajnal et al.

(10) Patent No.: US 12,000,912 B2
(45) Date of Patent: Jun. 4, 2024

(54) MRI SCANNER-COMPATIBLE VIRTUAL REALITY SYSTEM

(71) Applicant: KING'S COLLEGE LONDON, London (GB)

(72) Inventors: Joseph Hajnal, London (GB); Tomoki Arichi, London (GB); Kun Qian, London (GB)

(73) Assignee: KING'S COLLEGE LONDON, London (GB)

( * ) Notice: Subject to any disclaimer, the term of this patent is extended or adjusted under 35 U.S.C. 154(b) by 198 days.

(21) Appl. No.: 17/606,519

(22) PCT Filed: Apr. 24, 2020

(86) PCT No.: PCT/GB2020/051021
§ 371 (c)(1),
(2) Date: Oct. 26, 2021

(87) PCT Pub. No.: WO2020/217068
PCT Pub. Date: Oct. 29, 2020

(65) Prior Publication Data
US 2022/0349963 A1    Nov. 3, 2022

(30) Foreign Application Priority Data

Apr. 26, 2019 (GB) ..................... 1905847

(51) Int. Cl.
*G01R 33/28* (2006.01)
*G06F 3/01* (2006.01)
(52) U.S. Cl.
CPC .......... *G01R 33/283* (2013.01); *G06F 3/012* (2013.01); *G06F 3/013* (2013.01)
(58) Field of Classification Search
CPC . G01R 33/283; G01R 33/56509; G06F 3/012; G06F 3/013; G06F 3/011
See application file for complete search history.

(56) References Cited

U.S. PATENT DOCUMENTS

| 2009/0010510 A1* | 1/2009 | Schnell .................. A61B 5/742 382/128 |
| 2010/0234722 A1 | 9/2010 | Heller |

(Continued)

FOREIGN PATENT DOCUMENTS

| EP | 2992343 A | 3/2016 |
| WO | 2014178091 A1 | 11/2014 |

OTHER PUBLICATIONS

Machine translation of CN-107106076-A (Year: 2017).*

(Continued)

*Primary Examiner* — G. M. A. Hyder
(74) *Attorney, Agent, or Firm* — Stuart H. Mayer; Kaplan Breyer Schwarz LLP

(57) ABSTRACT

Aspects and embodiments provide an MRI scanner-compatible virtual reality system comprising: user equipment locatable within an MRI scanner bore, the user equipment being configured to provide a subject with an immersive virtual environment; the system further comprising: at least one sensor configured to track eye movement of the subject; wherein interaction of the subject with the immersive virtual environment is controlled by the tracked eye movement. Aspects and embodiments may be implemented in a manner which recognises that VR techniques, which typically rely upon dynamic movement of a VR subject, can be used to aid with maintenance of minimal motion of a subject to be placed within an MRI scanner bore. Implementations may be such that calmness of a subject can be increased and awareness of their physical surroundings diminished, thus allowing for successful MRI image acquisition whilst seeking to minimise distress, boredom and/or frustration experienced by the subject under study.

19 Claims, 6 Drawing Sheets

(56) References Cited

U.S. PATENT DOCUMENTS

| | | |
|---|---|---|
| 2011/0201916 A1 | 8/2011 | Dyun |
| 2013/0117377 A1 | 5/2013 | Miller |
| 2015/0200996 A1* | 7/2015 | Ziarati ................. A61B 5/0046 709/201 |
| 2015/0323617 A1 | 11/2015 | Ziarati |
| 2016/0063303 A1 | 3/2016 | Cheung |
| 2017/0326333 A1 | 11/2017 | Giap |
| 2018/0070904 A1 | 3/2018 | Yu |

OTHER PUBLICATIONS

Machine translation of KR-201701119938-A (Year: 2017).*
Machine translation of CN-110910513-A, (Year: 2020).*
Siemens AG Cem Tuhta TR-Istanbul et al: Birdcage Coil for Mitigating Claustrophobia during MRI Procedures, Prior Art Publishing GMBH, Prior Art Pub Li Sh I Ng GMBH, Manfred-Von-Richthofen-Str. 9, 12101 Berlin Germany, vol. Prior Art Journal 2018 #09, May 8, 2018 (May 8, 2018), pp. 177-179.

* cited by examiner

MRI SCANNER-COMPATIBLE VIRTUAL REALITY SYSTEM

FIELD OF THE INVENTION

Aspects of the invention relate to a Magnetic Resonance Imaging (MRI) scanner-compatible virtual reality (VR) system, and more particularly to a virtual reality system which can aid successful image acquisition in relation to subjects who otherwise find use of an MRI scanner and the restraints placed on the subject of an MRI scanner challenging or difficult.

BACKGROUND

Magnetic Resonance Imaging (MRI) is a clinical imaging technique which allows capture of images of anatomy and physiological processes which occur within, for example, a human body. MRI scanners use strong magnetic fields, magnetic field gradients and radio frequency magnetic fields to generate images of the anatomy and processes occurring within a body.

A typical MRI scanner has a relatively small and narrow scanner bore. The scanner bore is the area in which a strong magnetic field is created to study a subject placed in the MRI scanner.

Subjects can find being placed in an MRI scanner worrying. In the case of adults, such worries can stem from, for example, claustrophobia and/or suffering from confusion or dementia. Children may also get anxious before and during scanning.

In order to obtain clear and useful images from a subject placed within an MRI scanner, a subject must remain substantially still for the duration of the scan process. It is not uncommon to use general anaesthetic to enable young children to be scanned.

It is desired to provide a system for use in an MRI scanner which can help to alleviate or mitigate some of the issues raised above.

SUMMARY

Accordingly, a first aspect provides: an MRI scanner-compatible virtual reality system comprising: user equipment locatable within an MRI scanner coil, the user equipment being configured to provide a subject with an immersive virtual environment; the system further comprising: at least one sensor configured to track eye movement of the subject; wherein interaction of the subject with the immersive virtual environment is controlled by the tracked eye movement.

In some embodiments, the system is configured to provide a subject with an immersive virtual environment comprising visual and audio input selected to mitigate, minimise and/or prevent interaction of the subject with the virtual environment via gross physical movement.

In some embodiments, the system is configured to provide a subject with an immersive virtual environment comprising visual and audio input selected to encourage interaction of the subject with the virtual environment solely via eye movement.

In some embodiments, elements of the user equipment are constructed from materials which do not influence a magnetic field within an MRI scanner coil.

In some embodiments, elements of the VR systems which are magnetically or electrically disruptive are located outside the scanner coil. In some implementations, elements for presentation of a VR system resides with a subject to be locatable within the scanner bore. The elements for presentation travels with the subject to allow the immersive VR experience created by the system to start outside the scanner and continue undisrupted though all elements of the examination until the subject is removed from the magnetic scanner.

In some embodiments, visual input for provision of the immersive virtual environment is relayed to the subject from outside the scanner coil via an optical system including a projector and one or more mirrors.

In some embodiments, the at least one sensor configured to track eye movement of the subject comprises at least one camera forming part of the user equipment, and wherein the cameras are located on the user equipment a distance from a subject placed in the user equipment selected to mitigate electromagnetic interference in an MRI image captured by use of the scanner coil.

In some embodiments, a processing device required to create the virtual reality environment is located outside the scanner coil or bore.

In some embodiments, the user equipment is dimensioned to fit within the scanner coil or bore.

In some embodiments, one or more elements of the virtual reality system is removably decouplable from the MRI scanner.

In some embodiments, interaction of the subject with the immersive virtual environment is primarily controlled by the tracked eye movement.

In some embodiments, the user equipment comprises one or more limiters, located within the user equipment, to restrict head movement of the subject.

In some embodiments, the tracked eye movement comprises: gaze estimation achieved via pupil tracking.

In some embodiments, the tracked eye movement comprises: deformable eye shape tracking.

In some embodiments, the tracked eye movement comprises: pupil tracking including head pose compensation.

In some embodiments, the tracked eye movement comprises determining, from images obtained by the sensors, subject head movement and wherein the system is configured to use the determined head movement to correct or compensate MRI images obtained by the MRI scanner.

In some embodiments, changes in subject head pose are estimated based on displacements of eye corners determined from one or more images of the subject's eye captured by the sensors, and wherein the changes are used to provide motion compensation.

In some embodiments, the system is configured to provide a subject with an interactive gaze target to provide subject feedback and improve overall engagement with a target.

In some embodiments, the interactive gaze target comprises: an icon which changes or evolves whilst gaze of the subject is determined to remain in contact with the gaze target.

In some embodiments, the immersive virtual environment is concordant with a physical environment experienced by the subject.

In some embodiments, the user equipment includes sound sensors configured to provide an input to the system such that an aural landscape forming part of the virtual environment includes main elements of an aural landscape within the scanner coil.

In some embodiments, the user equipment includes one or more motion sensors configured to provide an input to the system such that a visual landscape forming part of the virtual environment is concordant with motion experienced by a subject within the scanner coil.

In some embodiments, the system comprises sound and image sensors configured to provide the system with information about a party located outside the scanner coil and to insert a representation of the party into the virtual environment to interact with the subject.

It will be appreciated that a further aspect of the invention relates to a method of use of the apparatus of the first aspect. In particular to: providing an MRI scanner-compatible virtual reality system: by locating a user equipment within an MRI scanner coil, said user equipment being configured to provide a subject with an immersive virtual environment; the method further comprising: configuring at least one sensor to track eye movement of said subject; and providing an arrangement in which interaction of a subject with the immersive virtual environment is controlled by tracked eye movement of the subject.

Method steps corresponding to the apparatus features described in relation to the first aspect can be provided.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

Embodiments of the present invention will now be described further, with reference to the accompanying drawings, in which.

DESCRIPTION OF THE EMBODIMENTS

Figure 1:
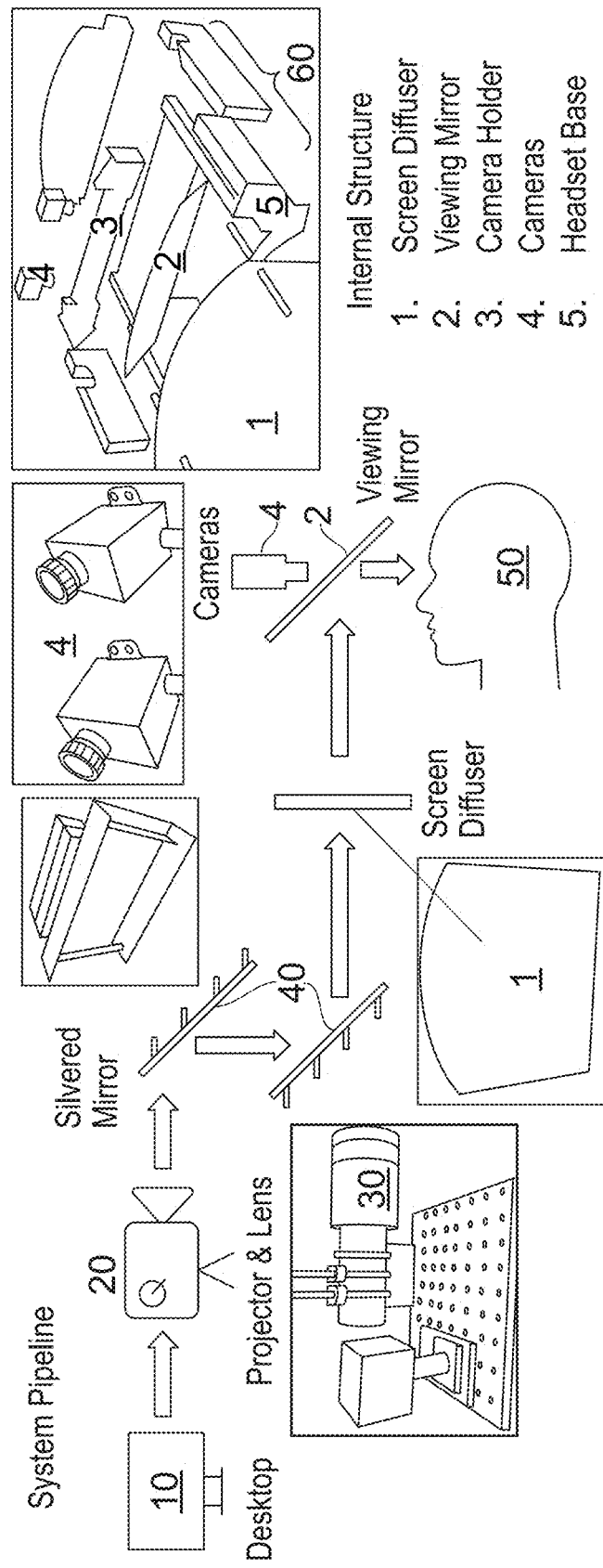
FIG. 1 illustrates an optical projection system devised for use in one possible arrangement.

As mentioned above, many adults find the process of being placed in an MRI scanner in order to be scanned a worrying event. This can be particularly notable if the adults are claustrophobic or suffering from confusion or dementia. Many children also get anxious before and during MRI scanning and in it is not uncommon to use general anaesthetic, or sedation to enable subjects to be scanned. It will be appreciated that use of anaesthesia has associated risks and costs. Known methods to address these challenges differ according to age: up to about the age of two, it is feasible to scan a child during natural sleep. As infants get older, imaging therefore has to be moved towards night time, eventually scanning deep in the night to extend the age range of natural sleep imaging. Once a child is too old for natural sleep to be a reliable mechanism to allow for successful MRI imaging, options are limited until there is enough maturity to allow extended scanning again. From around the age of five, it is possible to show films or other distracting material to allow reasonable examination durations to be achieved, although this is only partially successful.

Similarly, systems are known according to which adults are shown calming images whilst within a scanner bore, with the intention being to soothe and to assist in minimising movement of a subject within an MRI scanner. Such systems typically do not remove peripheral vision cues, and those cures can remind a subject where they are which may lead to distress.

Arrangements can be implemented in which a fully MRI compatible, completely immersive virtual reality system can be provided to a subject within an MRI scanner bore. Such a system may include various components and features, including for example: an MR-safe visual display system; eye tracking which allows a subject to interact with a virtual environment without a need for full head movement, thus maintaining a degree of stillness of a subject within a scanner bore, and removing the need for head movement within a limited-space scanner bore. Arrangements may be implemented in which sustained gaze from a subject is used for calibration and for controlling selection of options within the VR environment, and an ability to directly control games and perform other tasks using eye movements can be provided by means of eye tracking and appropriate eye tracking algorithms. It will also be appreciated that eye tracking can provide a useful neuroscience/clinical evaluation tool and can be used to provide prospective tracking of a subject's head for MRI motion correction. Such additional features are described in more detail below. Some arrangements can provide a direct video injection capability in which a second party located outside an MRI suite can interact with a subject in the scanner as within the immersive virtual environment being provided to that subject. Similarly, some arrangements can provide for two-way audio communication allowing a subject to communicate with the second party and/or with an MRI scanner operator. Some arrangements can provide for optional hand tracking thus allowing for the provision of motor input to the VR world, and allowing a subject an enhanced sense of immersion in the virtual environment and potentially allow small motor tasks to be performed for the purposes of neuroscientific and/or clinical experiments. Arrangements can be implemented which provide a fully immersive MRI-compatible VR system into which a subject can be placed, prior to entering an MRI scanner or scanner bore. Arrangements can be implemented which provide for a second party, for example, a parent, to join a subject in the virtual environment provided to the subject whilst within an MRI scanner bore.

In general, arrangements may be implemented which recognise that VR techniques, which typically rely upon dynamic movement of a VR subject, can be used to aid with maintenance of minimal motion of a subject to be placed within an MRI scanner bore. Implementations may be such that calmness of a subject within an MRI scanner bore can be increased and awareness of their physical surroundings (inside a small scanner bore) diminished, thus allowing for more successful image acquisition whilst seeking to minimise distress, boredom and/or frustration experienced by a subject.

Arrangements can be implemented in ways which provide an MRI-compatible VR system offering a fully immersive and interactive experience to a subject. Arrangements can provide control by eye movement; an ability to introduce a third-party avatar and can be implemented such that a subject to be scanned can be using the system before they enter the bore of a scanner, thus distracting them from any preparations being made for image acquisition.

Before particular features are described in more detail, a general overview of an approach and possible arrangements is provided.

Achieving compatibility of VR systems with MRI scanners is challenging. For applications such as fMRI, it is highly desirable to avoid local distortions of the static magnetic field. Arrangements recognise that it is possible to develop a non-intrusive MR compatible VR system which avoids disturbing the magnetic environment within a scanner bore and uses eye tracking as the main interface of a scan subject with the VR environment. Approaches are capable of bringing a VR world into MRI systems, including dynamic interaction with VR content based on gaze.

VR in an MRI Scanner Environment

Virtual reality (VR) technology can provide an immersive interactive simulated environment which has potential to, for example, reduce anxiety experienced by a subject being scanner during the scan process which may last an hour or more. Although the VR gaming industry is booming, devices intended for use in a clinical environment remain relatively crude.

Various challenges arise in relation to the use of VR technology within an MRI scanner environment. Those challenges include, for example, placing electronic equipment in a strong magnetic field in such a way that the equipment and the imaging are not compromised. Achieving compatibility with MRI scanners is challenging and for applications such as fMRI, it is highly desirable to avoid local distortions of the static magnetic field. Further challenges are presented by a desire to interact with a VR environment provided to a subject. In many VR systems, a sense of immersion relies on subject movement, for example, head movement and head movement tracking to create active control by a subject of a visual scene being presented. Encouraging movement of a subject within a small scanner bore is clearly undesirable for an MRI application: resulting images will lack clarity and large physical movements of a subject within the bore are simply not possible. Whilst eye control of a VR system may appear to be a viable alternative in a limited motion scenario, one challenge in achieving robust eye control is a need to correct for head movements which is usually achieved by obtaining unobstructed views of a full face of a subject. Such a view is typically not feasible to obtain within a standard MRI scanner head receiver coil.

Arrangements seek to provide a non-intrusive MR compatible VR system which avoids disturbing the magnetic environment within a scanner and uses eye tracking as the main interface to minimise subject movement, yet allow control of the VR environment.

Arrangements offer a VR system to a subject in which the subject does not use head or body movements to control the VR environment being provided to a subject. Whilst commercially available gaming systems may be available which use eye movements and eye tracking, those eye movements are typically used to determine a direction that the subject is facing rather than determine gross movements, or gross interaction with a VR environment. In other words, most VR systems track gross motor movements such as hand waves, head tracking, posture and similar to drive primary interaction of a subject with a virtual environment, and eye tracking is used to refine that interaction, rather than used as a primary or only means of interaction. Arrangements may provide a VR system in which eye movement/eye tracking alone is used to control interaction of a subject with a virtual environment. Accordingly, arrangements provide a mechanism to control and interact with a VR environment in instances where physical motion of a body of a subject is constrained, for example, because the subject has been placed in an MRI scanner bore.

MRI Scanner Compatibility

To substantially avoid disturbance of imaging fields within an MRI scanner, various techniques can be adopted. For example, elements of the VR system to be located within the scanner bore may be chosen to include no magnetic or electrically disruptive material, and/or material likely to be magnetically or electrically disruptive may be shielded or configured within the bore to minimise magnetic and electrical disruption. In particular: rather than provide active display apparatus, such as an LCD screen, within the bore, the visual input to a subject may be provided via projection and mirrors. Similarly, one or more sensors, such as cameras, used for the purposes of tracking eye movement, may be located a sufficient distance from a subject to mitigate electromagnetic interference in an MRI image to be captured. Such cameras may also comprise MRI compatible cameras which are shielded to avoid electromagnetic interference.

Processing devices (the computer and similar) required to create and maintain a virtual reality environment may be located outside the scanner bore. The elements of the system necessary to provide an experience to a subject may be dimensioned to fit within the scanner bore. The elements of the system necessary to provide an experience to a subject may be decouplable from the MRI scanner, such that a subject may be placed on a scanner table and immersed in the VR environment whilst outside a scanner bore. In some arrangements, the user equipment is dimensioned to fit in or around a scanner head coil, RF coil, or scanner bore. Arrangements may be implemented such that the system is being scanned with another coil, for example, a coil for a cardiac examination. Arrangements may allow for the user equipment to provide an immersive visual field wherever the subject is placed within the MRI scanner. That is to say, an immersive environment can be provided whether the head, or other component of a subject's body is being imaged by the MRI scanner. In relation to head scanning, arrangements are implemented such that the user equipment and other components do not disrupt imaging. That is to say, they are provided such that the VR system does not disrupt magnetic fields used for imaging. In relation to cases where a magnetic field within a scanner is used to image a portion of a subject's body remote from the head (for example, the torso, or lower limbs, ensuring the VR system provided at the subject's head does not disrupt fields essential to imaging may be simpler than in cases where the head is being imaged.

FIG. 1 illustrates an optical projection system devised for use in one possible arrangement. A desktop computer and digital projector (in the example illustrated, Aaxa Technologies, HD Pico) are located outside a room in which the MRI scanner is housed. Such an arrangement allows for rapid prototyping of stimulus presentation without causing electrical interference. A standard projector lens has been replaced with a Kodak Ektapro Select 87-200 zoom lens, arranged to project through an open waveguide. Two front silvered mirrors mounted on non-magnetic stands are configured to steer a projector beam to an MRI scanner bore. A 3D printed plastic device is configured to mate precisely with a Philips 32 channel head coil and is arranged to include a holder for a diffuser screen which can be viewed in transmission and a clear acrylic reflector. In the arrangement shown, eye tracking can be achieved using live video from two on-board MRC 12M-I IR-LED cameras mounted on an adjustable holder. Images from the live video can be assessed and subject gaze direction inferred from the live video. The VR system processor may be configured to convert gaze data into control signals for subject interaction with a virtual environment. The system illustrated in FIG. 1 has been developed using the Unity game engine and the arrangement provides a tracking system based on OpenCV and deep learning libraries (Dlib and Tensorflow).

The system of FIG. 1 was tested for MRI compatibility on a 3T Philips Achieva system by imaging a spherical phantom and a normal volunteer using field echo planar imaging (EPI) with parameters taken from a typical fMRI protocol and checking for changes in SNR and geometric distortion. There was no detectable change in SNR or geometric distortion without and with the complete system shown in FIG. 1 in place.

Figure 2:
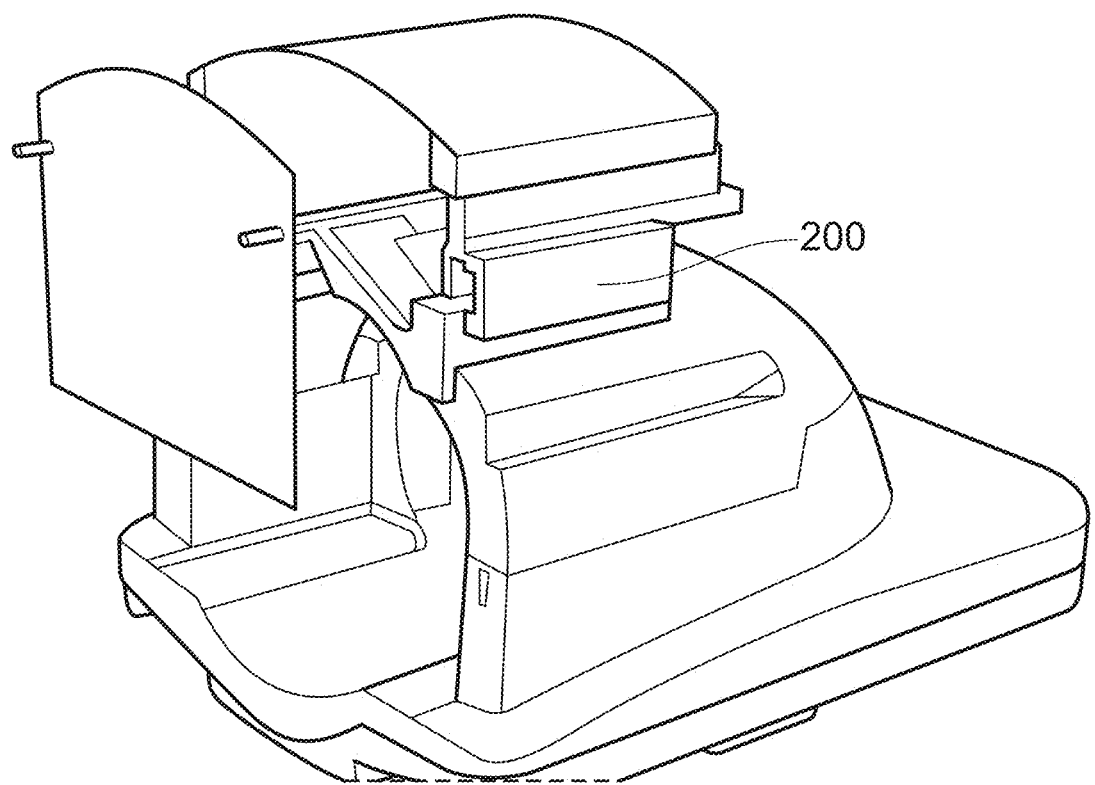
FIG. 2 shows user equipment forming part of a VR system, that user equipment being locatable within a scanner bore.

FIG. 2 shows user equipment 200 forming part of a VR system, that user equipment being locatable within a scanner bore. As shown in FIG. 2, the user equipment 200 may be placed on a typical MRI scanner head coil. Arrangements may be provided in which the user equipment 200 can be integrally formed with MRI scanner head apparatus. The user equipment 200 may be removably detachable from the rest of a MRI scanner, to allow a VR environment to be provided to a subject before entry to an MRI scanner.

Eye Tracking

To provide a mechanism for a subject located within a scanner bore to interact with a virtual environment, whist not encouraging gross motor movement, eye scanning techniques to allow gaze control can be implemented such that they can act as a primary subject input. It will be appreciated that arrangements can be such that cameras are provided as part of user equipment locatable within a scanner bore. Those cameras may be located such that substantially their entire field of view is occupied by an image of an eye of a subject. The cameras may be located outside a scanner head coil, and placed such that they are not damaging to imaging performance. It will be appreciated that typically physical objects such as lenses placed very close to the subject being imaged can cause signal drop-out and/or distortion in fMRI and diffusion imaging.

Since the motion of the head of a subject is relatively restricted whilst in an MRI scanner head coil, eye and gaze scanning techniques according to arrangements may focus primarily upon eye movement, rather than a need to factor in, or correct for, gross movement of a subject's head. Some arrangements may be such that images of subject eye(s) can be used to determine head movement. That head movement may then be used to correct or compensate MRI images obtained.

Some arrangements may provide for hand operated buttons and similar to add control and interaction with a virtual environment via means which are additional to the primary eye tracking. Such controllers may, for example, include: buttons, joysticks and/or tracking small hand gestures.

Figure 3:
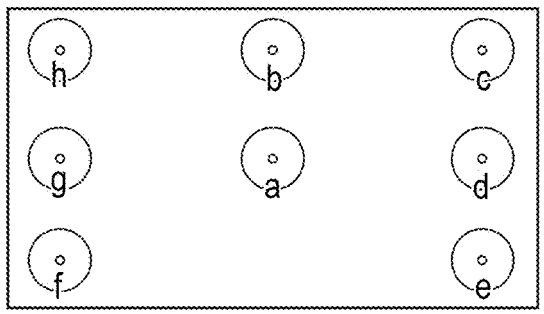
FIG. 3 illustrates schematically main components of a calibration process for gaze tracking.
Figure 3:
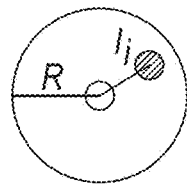

FIG. 3 illustrates schematically main components of a calibration process for gaze tracking. According to some arrangements, gaze estimation is achieved by pupil tracking combined with deformable eye shape tracking based on a 6-landmark shape descriptor for each eye to achieve head pose compensation [i]. The landmarks set out in FIG. 3 are used to guide application of an adaptive density-based pupil tracking algorithm. Pupil-eye-corner feature vectors are regressed onto a gaze point on the screen after a screen space calibration procedure. Changes in head pose can be estimated from displacements of eye corners and used to provide motion compensation. Some arrangements provide an interactive gaze target to provide subject feedback and improve overall engagement with a target. For example, an interactive gaze target may comprise an icon which changes or evolves whilst a subject's gaze remains in contact with the target. Such an arrangement, in which continued and immediately obvious feedback is provided to a subject based on a consistent gaze pattern can aid use of a VR system in which gaze control is a primary input for subject interaction with a virtual environment.

FIG. 3 shows typical eye images, with key landmarks and calibration data overlaid. Gaze accuracy and precision data for a single subject are shown in FIG. 2. Immersive content was generated with an integrated calibration procedure and subsequent use of gaze control and has been tested on volunteers. The system provided a strong immersive visual experience that could be controlled interactively by the subject.

The arrangement of FIG. 3 has been found to have comparable performance to a reference "typical" system and also showed less drift in performance measures over time. In particular, a VR system having gaze control in line with that outlined in FIG. 3 had its performance tested on adults and children, and gaze measurement achieved has been compared to a Tobii 4C gaming eye tracker system using metrics set by Tobii [2]. Matched calibration and testing conditions were used for both systems. For calibration the subject looks at on screen targets and the corresponding pupil positions are recorded. Precision and accuracy testing involves the subject fixing their gaze on a succession of 8 target markers and recording detected gaze location for each target for 10 seconds. This test was repeated after a delay of 2 minutes to check for any drift in performance.

TABLE 1

| | a | b | c | d | e | f | g | h | Overall |
|---|---|---|---|---|---|---|---|---|---|
| Accuracy: the average difference between the target position and the measured gaze position | | | | | | | | | |
| Tobii | 0.23 | 0.27 | 0.60 | 0.58 | 0.64 | 0.57 | 0.29 | 0.37 | 0.44 |
| Ours | 0.19 | 0.17 | 0.16 | 0.20 | 0.18 | 0.26 | 0.31 | 0.87 | 0.29 |
| Precision: the variation of the gaze position | | | | | | | | | |
| Tobii | 0.07 | 0.12 | 0.16 | 0.08 | 0.26 | 0.19 | 0.12 | 0.12 | 0.14 |
| Ours | 0.26 | 0.22 | 0.19 | 0.31 | 0.20 | 0.17 | 0.09 | 0.44 | 0.24 |

Figure 4:
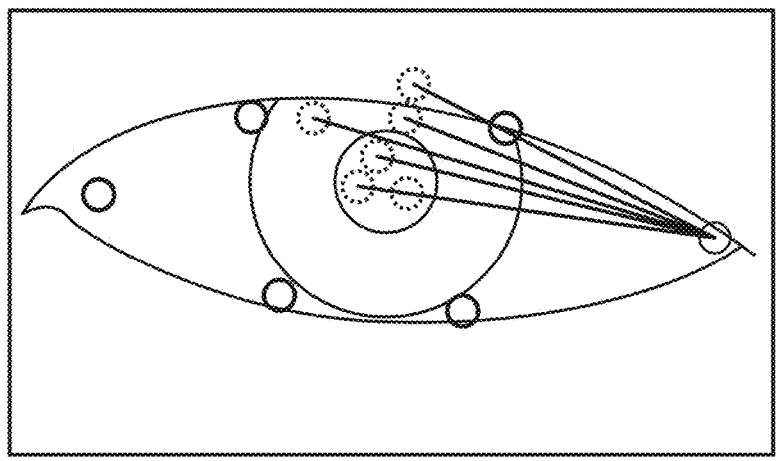
FIG. 4 shows typical eye images, with key landmarks and calibration data overlaid.
Figure 4:
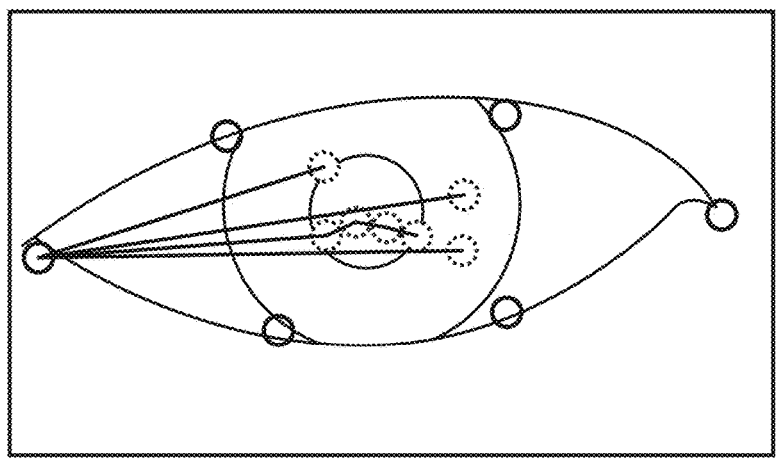

Table 1 comprises a performance comparison of a gaze tracker operating in accordance with the methods set out in relation to FIGS. 3 and 4 and which is implemented in accordance with user equipment such as that shown in FIG. 2. In particular, the cameras and eye tracking occur in relation to a subject placed in an MRI head coil. The performance is compared with a Tobii 4C commercial gaming system using the metrics proposed by Tobii. Note that all distances are expressed as fractions of an on-screen target perimeter circle radius to remove any effects of differential screen size.

Immersivity

Arrangements recognise that it can be beneficial to offer a virtual environment which is immersive to a subject. In other words, one or more senses of a subject may be tricked into believing that the virtual environment can replace the physical environment (ie the MRI scanner) surrounding the subject. In this respect, various senses may be addressed by suitable provision within the virtual environment provided to a subject. The primary senses of interest within the MRI scanner application are those of: sight, sound and touch. Various methods may be provided to ensure a subject experience is concordant between the virtual environment and any aspect of the real physical environment which may be apparent to a subject.

In some arrangements, a subject under study can become immersed in a virtual environment whilst located physically away from the scanner, so they do not need to be confronted with a worrying claustrophobic threat.

In some arrangements, the entire visual experience of a subject is provided by the virtual environment. That is to say, the entire field of vision of a subject is providable for by a virtual environment. Any region which is not part of the virtual environment is blanked, or blocked such that a subject cannot see the physical environment surrounding them. For example, a headset may be provided which includes a virtual scene, but any area which is not part of the created virtual scene can be blocked by a screen or other obstruction, thus ensuring a subject cannot see their actual physical surroundings. In some arrangements, complete visual stimulus is provided by the system, including ensuring peripheral vision on a subject does not all ow for a subject to interact and see the actual physical environment in which they are located. That is to say, arrangements may provide for blocking of a subject's peripheral vision, and/or provide peripheral visual information as part of the virtual environment created for a subject.

Sensors, for example, movement sensors, which may be gyroscopic and/or accelerometer type sensors, may be provided on a headset, or on a table on which a subject is locatable, such that any physical movement experienced by a subject in the physical environment surrounding them can be accommodated and coincident with movement apparent in the virtual environment. For example, the movement of the subject into the scanner bore may be detectable to a subject and the virtual environment may seek to provide a similar "moving/sliding in" experience visually to a subject within the virtual environment.

Noise sensors, for example, microphones, can be provided such that any noise which exists in the physical environment surrounding a subject can be accommodated and "explained" by a factor within a created virtual environment. For example, the noise of an MRI scanner may be significant and may be disturbing to a subject. Provision of an "explanation" for the MRI scanner noise within the virtual environment may help a subject to forget their real physical environment. For example, the noise of the MRI scanner may be "provided" by a loud event within the virtual environment, such as use of a pneumatic drill, work occurring on a building site, the rumble of traffic, or similar.

According to some arrangements, congruence between a "real" environment and the virtual environment is achieved via creation of visual features which correspond to an externally sensed "real" audio environment. Although an MRI subject typically wears ear defenders it is often impossible to remove external sounds completely. Thus arrangements can seek to make the virtual environment provided to the subject have recognisable visual features which serve to make perceived sounds explicable. For example, a virtual road digger with a pneumatic drill can be inserted into the virtual environment to "explain" to a subject noises made by an MRI scanner as it operates.

Some arrangements provide mechanisms via which control over a complete visual and auditory scene experienced by a subject are provided, together with sensors to provide information about how the subject is interacting with the virtual environment provided by the system (both active control and passive observation of their gaze location, or other physiological sensor(s)). Such arrangements can have particular use and application in relation to the provision of exceptional information to use for fMRI (functional MRI) studies. For example, the system may be configured to expose the subject to a complex scene and it will be possible to know which part of the complex scene the subject attended to via eye tracking and when that attendance occurred, and correlate that information to images acquired.

Subject Reassurance

Arrangements recognise that being within an MRI scanner bore may present a challenge to subjects and that distraction via provision of an alternative reality, which is less space constrained and/or intimidating can aid with the acquisition of clear and useful MRI images. Some arrangements recognise that subject comfort and reassurance can be further improved by provision of a known "third person" within the virtual environment. For example, some arrangements allow for an avatar representation, or video representation of a third person, such as a carer, or parent, within the virtual environment provided to a subject. That person may be available to a subject both visually and aurally. A VR system in accordance with arrangements may comprise a camera, microphone and "green screen" outside the scanner bore, such that a real representation of a third person may be provided within the virtual environment. The third person may be able to see the virtual environment being provided to a subject, and to interact conversationally with a subject within the scanner bore via the virtual environment. Accordingly, a child may be reassured by the presence, both visual and aural, of a parent within the virtual environment. An older, or incapacitated person may be similarly reassured by the presence of a carer within the virtual environment.

Discussion

Arrangements described demonstrate a capability to successfully bring an immersive VR world into MRI systems. Arrangements can provide for dynamic interaction with VR content based on gaze. Gaze tracking according to arrangements can have a performance that it is competitive to the current best commercial gaming eye tracker. The non-intrusive and contactless design of the user equipment locatable within the scanner bore is such that does not require any preparation work before the scan (such as sticking markers to the subject's face) in order to allow a subject to control interaction with a virtual environment, and/or to allow for any movement of the head of a subject to be calculated, from inferred movement of eye corners. Arrangements have application in both clinical areas in relation, for example, to subjects who find MRI stressful (such as those with claustrophobia or children) and in relation to neuroscientific research [3] with, for example, potential to provide motion correction in relation to image data collected.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

VR System Use

Figure 5:
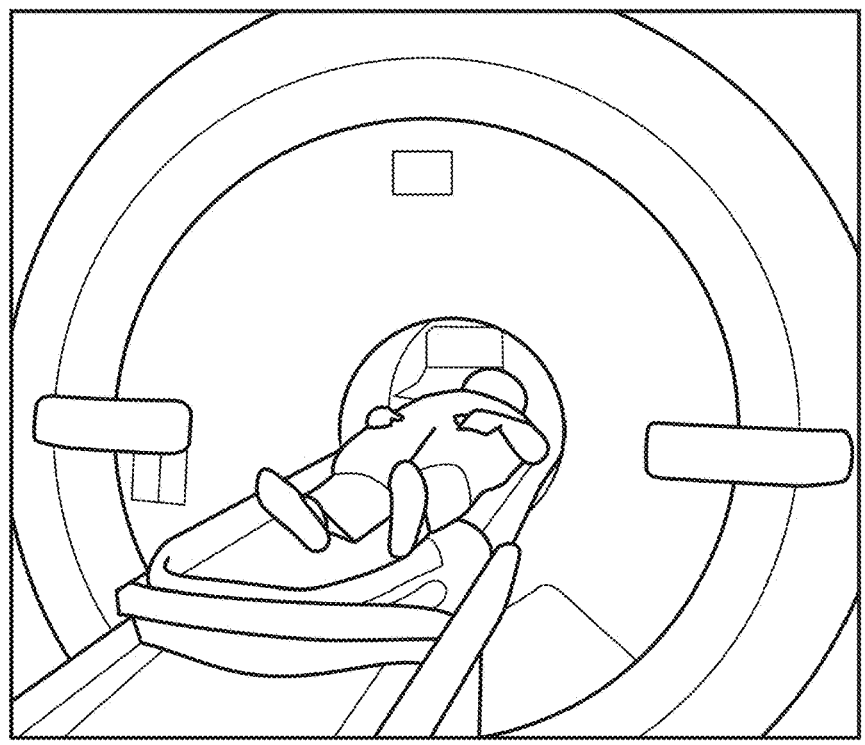
FIG. 5 shows a subject being placed into an MRI scanner bore.

FIG. 5 shows a subject being placed into an MRI scanner bore. Some arrangements allow for a subject to be inserted into the VR system and onto an MRI scanner table whilst the subject is outside the room containing the MRI scanner. Accordingly, the immersive nature of the VR system may serve to alleviate any concerns or discomfort a subject may experience in relation to insertion into the small physical space offered by an MRI scanner bore.

Figure 6:
FIG. 6 shows screenshots of visual elements of a virtual environment provided to a subject in an MRI scanner bore according to one arrangement.

FIG. 6 shows screenshots of visual elements of a virtual environment provided to a subject in an MRI scanner bore according to one arrangement. In the examples shown there are elements being shown to a subject, with which the subject can interact by appropriate eye movement.

Further Comments Regarding VR in an MRI Scanner Environment

As described above, aspects recognise that various challenges arise in relation to the use of VR technology within an MRI scanner environment. In particular, arrangements seek to offer an interactive VR system to a subject in which the subject does not use gross head or body movements to control the VR environment being provided. Furthermore, arrangements seek to limit the extent to which a subject might feel a desire to move significantly, by providing visual and audio stimulus which is concordant with one or more sensations or stimuli being received by a subject from the real world. Such stimuli include, for example, sensations relating to vision, body movement and sound.

Some arrangements recognise that the placing of a subject on an MRI table is likely to require them to be in a supine position. For example, the sensation of being supine will be apparent to a subject when laid on the table and providing initial visual VR input to the subject which accounts for that supine position can allow the subject to relax and feel more comfortable. Similarly, as the table moves into a scanner bore, it is likely to be apparent from stimuli received by their body that they are being moved. Providing visual VR input to the subject which accounts for that movement and/or vibration generated by an MRI scanner can allow the subject to relax and feel more comfortable and initiate a sense of complete immersion into a virtual environment.

In such a scenario, movement sensors may be mounted on the subject support which provide one or more signal to the VR system so that visual stimulus in the virtual environment can be matched to real world gross movement of components of the MRI scanner being experienced by a subject. In some arrangements, analysis of a live video stream of a subject within a MRI scanner room, or within the scanner bore can be used to provide an indication of likely stimuli being experienced by a subject.

Similarly, audio in the virtual environment being provided to a subject may take into account audio stimuli occurring in a real environment surrounding a subject. Accordingly, the VR system may comprise one or more audio sensors or microphones provided to pick up an audio signal being experienced by a subject as a result of a surrounding environment. The VR system may be configured to match an audio and/or visual signal to provide to a subject through the VR output which accounts for the real-world movement and/or sound.

The system is configured to provide a virtual environment to a subject which encourages the subject to remain substantially still, thereby preventing or mitigating movement of the subject whilst MRI images are captured. Prevention of gross physical movement of one or more limbs of a subject can aid capture of useful images from the MRI scanner. The system may be configured to provide a virtual environment in which it is natural for a subject to move their eyes, rather than whole head or body, in order to interact with that virtual environment.

Further Comments Regarding MRI Scanner Compatibility

As described above, to ensure fields within a scanner bore are minimally disrupted, a system according to arrangements may include various mitigating features and approaches. For example, elements of the VR system to be located within the scanner bore may be chosen to include no magnetic or electrically disruptive material, and/or material likely to be magnetically or electrically disruptive may be shielded or configured within the bore to minimise magnetic and electrical disruption. In particular: a shielded active display apparatus, such as an LCD screen can be collocated with a patient headset and therefore it may be possible to place a subject within the virtual environment whilst being prepared for entry to the MRI scanner, and use the system to disguise, or mask entry of the subject into the narrow bore of the MRI scanner. In particular, in relation to components of the VR system placed close to the head of a subject, optics of the system can be arranged, located or configured such that they are not too close to the head of the subject. Accordingly, disruption and distortion to imaging of the head via MRI techniques may be prevented. As described above, one or more sensors, such as cameras, used for the purposes of tracking eye movement, may be located a sufficient distance from a subject to mitigate electromagnetic interference in an MRI image to be captured. Such cameras may also comprise MRI compatible cameras which are shielded to avoid electromagnetic interference. Fixing, or providing elements of the VR system such that they remain substantially static around the subject may allow for uninterrupted immersion of the subject within a virtual environment.

Processing devices (the computer and similar) required to create and maintain a virtual reality environment may, of course, still be located outside the scanner bore. The elements of the system necessary to provide an experience to a subject may be dimensioned to fit within the scanner bore.

Further Comments Regarding Functional MRI

As described previously, the motion of the head of a subject is relatively restricted whilst in an MRI scanner head coil. In fact, the restriction of head movement is necessary to ensure images obtained from the system are clear and useful. Monitoring movement of a subject eye pupil or other identifiable eye features, for example, eye socket positions, may allow a system to calculate likely gross movement of a subject head and then feed that calculated inferred movement to an MRI image capture system, so that appropriate corrections can be made in a resulting captured MRI image.

In any case, within the VR system, monitoring movement of a subject's eyes allows for adaptation of visual material being provided to a subject whilst using the system. Moreover, movement of a subject's eye can be used as a primary mode of interaction of a subject with a VR environment. As a result, choices being made by a subject within a VR environment are effected by movement of the eye of a subject. Arrangements may provide that information regarding the virtual environment and the VR system, for example, information regarding an option or choice being made by a subject, can be provided to an MRI system. As a result, study of functional systems within a subject's brain may be facilitated.

Furthermore, since the VR system may be configured to allow a subject to interact with the system additionally via verbal control and/or via small manual movements, such as pressing of a button or by tracking of hand or finger movements. It will be appreciated that, choices being made by a subject within a VR environment can be effected by the verbal interaction or manual interaction and thus that some arrangements may provide information regarding the virtual environment and the VR system, for example, information regarding an option or choice being made by a subject, to an MRI system. As a result, study of functional systems, for example, those triggered by a need to make a choice, or a need to make a sound or move a limb, within a subject's brain may be facilitated.

Further Comments Regarding Eye Tracking

As described previously, implementations provide a mechanism for a subject located within a scanner bore to interact with a virtual environment, whist not encouraging gross motor movement. Eye scanning techniques according to implementations allow subject gaze control to be implemented such that gaze acts as a primary subject input. Implementations may allow for an optical flow tracking. The system may be configured to implement progressive, adaptive calibration of subject gaze. Accordingly, some implementations operate such that when a subject makes a selection and/or provides an input to the VR system using gaze control, a detected pupil and/or head position is correlated to a known "target" location, that is to say, a feature within the virtual environment with which the subject is interacting. Correlation between the detected pupil position and the target can be used in a system calibration step, allowing the system to update an eye tracking model used to convert subject pupil location to gaze point. The monitoring of eye, pupil and/or head position and correlation with target location may be repeated throughout interactions of a subject with the VR environment. Such ongoing calibration helps to achieve a robust and stable gaze tracking system.

Immersivity and Provision of a Virtual Environment

Arrangements recognise that it can be beneficial to offer a virtual environment which is immersive to a subject. In other words, one or more senses of a subject may be tricked into believing that the virtual environment can replace the physical environment (ie the MRI scanner) surrounding the subject. In this respect, the system may, in arrangements, allow for various senses may be addressed by suitable provision within the virtual environment provided to a subject. The primary senses of interest within the MRI scanner application are those of: sight, sound and touch. Various methods may be provided to ensure a subject experience is concordant between the virtual environment and any aspect of the real physical environment which may be apparent to a subject.

Visual Input

In some arrangements, the entire visual experience of a subject is provided by the virtual environment. That is to say, the entire field of vision of a subject is providable for by a virtual environment. Any region which is not part of the virtual environment is blanked, or blocked such that a subject cannot see the physical environment surrounding them. In this respect, inadvertent exposure to peripheral vision cues, which may allow a subject to become aware of a surrounding real-world environment, can be mitigated or prevented by a system.

Arrangements recognise that various physical difficulties may arise in providing a suitable VR environment to a subject located within an MRI scanner bore. In particular, a typical VR headset is located very close to and surrounding a user's head. Many systems, even those which make use of a mobile phone as a screen, are directly mountable to the head or body of a user, so that movement of the user can be easily tracked using sensors, for example, accelerometers or similar, in the headset or phone. Locating a screen close to the eyes of a user can ensure that appropriate three-dimensional VR images can be provided to the user and that substantially the entire visual environment provided to a user is controlled and accounted for. In a cinema or home cinema scenario, a screen providing 3-D images to a user is typically located some distance from the user. Cinema and home users often wear specific glasses, for example active shutter glasses, or glasses having coloured lenses, to allow the three dimensional imaging to be successfully processed by a user. Neither option is directly available to a user within an MRI scanner bore: it is undesirable to locate a screen close to the eyes of a subject as in a VR headset, nor can appropriate glasses be provided, since those items may cause local interference to magnetic fields and/or may be intrusive or uncomfortable to a subject in relation to long duration scanning.

Some arrangements are configured to provide an anaglyph image to a subject locatable within an MRI. The system may comprise an anaglyph colour filter located to allow a subject to view an anaglyph image being provided by a visual display mechanism to the subject. The anaglyph filter is spaced from the eyes of a subject in the scanner to ensure no risk of disturbance to local static magnetic fields and to make the system minimally intrusive to the subject.

Audio Input

One or more microphones may be provided such that sounds being experienced by a user are detected. The system may be configured to recognise commonly experienced noises within the MRI environment and provide a response within the virtual environment which is congruent with the sound being experienced within the MRI scanner. The system may comprise one or more speakers which can add to the audio experience of a subject. Accordingly, a system may be configured to provide a virtual environment "cover" sound for a sound which occurs within the real world environment. In some arrangements, microphone and speaker arrangements may be such that real-world noise cancellation may occur within the virtual environment.

Movement

Sensors, for example, movement sensors, which may be gyroscopic and/or accelerometer type sensors, may be provided on a headset, or on a table on which a subject is locatable, such that any physical movement experienced by a subject in the physical environment surrounding them can be accommodated and coincident with audio and visual material provided to a subject. For example, vibration experienced in the real world by a subject may result in distortion or "vibration" of visual and/or audio material provided to a subject within the virtual environment.

Further Comments Regarding Subject Reassurance

The system may be configured to provide a user or spectator outside an MRI scanner bore with an indication or copy of the virtual environment being experienced by a subject within the MRI scanner bore. Provision of the virtual environment to, for example, a carer, supervisor, MRI scanner operator or parent located outside the scanner can allow for audio interaction related to the virtual environment between that person and a subject located within the scanner bore. That audio interaction can aid reassurance to a subject within a scanner.

Headset Adaptations

Figure 7:
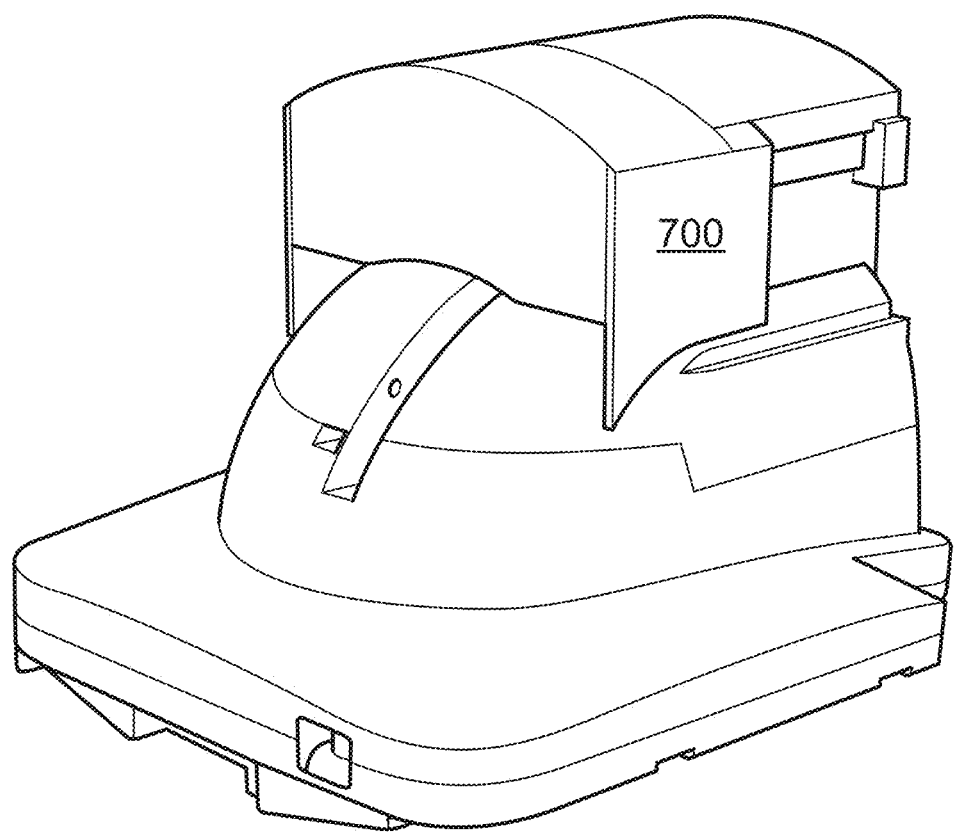
FIG. 7 shows alternative user equipment forming part of a VR system, in the form of a headset locatable within an MRI scanner bore.

FIG. 7 shows user equipment 700 forming part of a VR system, that user equipment forming part of a headset, or being retrofitable to an existing MRI scanner headset, and being dimensioned to be locatable within an MRI scanner bore. The user equipment may be constructed from components which are compatible with MRI scanning and which minimise interference to an MRI field. As shown in FIG. 7, the user equipment 700 may be locatable on a typical MRI scanner head coil. Arrangements may be provided in which the user equipment 700 can be integrally formed with MRI scanner head apparatus. The user equipment 700 may be removably detachable from the rest of a MRI scanner, to allow a VR environment to be provided to a subject before entry to an MRI scanner, for example, whilst being prepared for entry.

Figure 8:
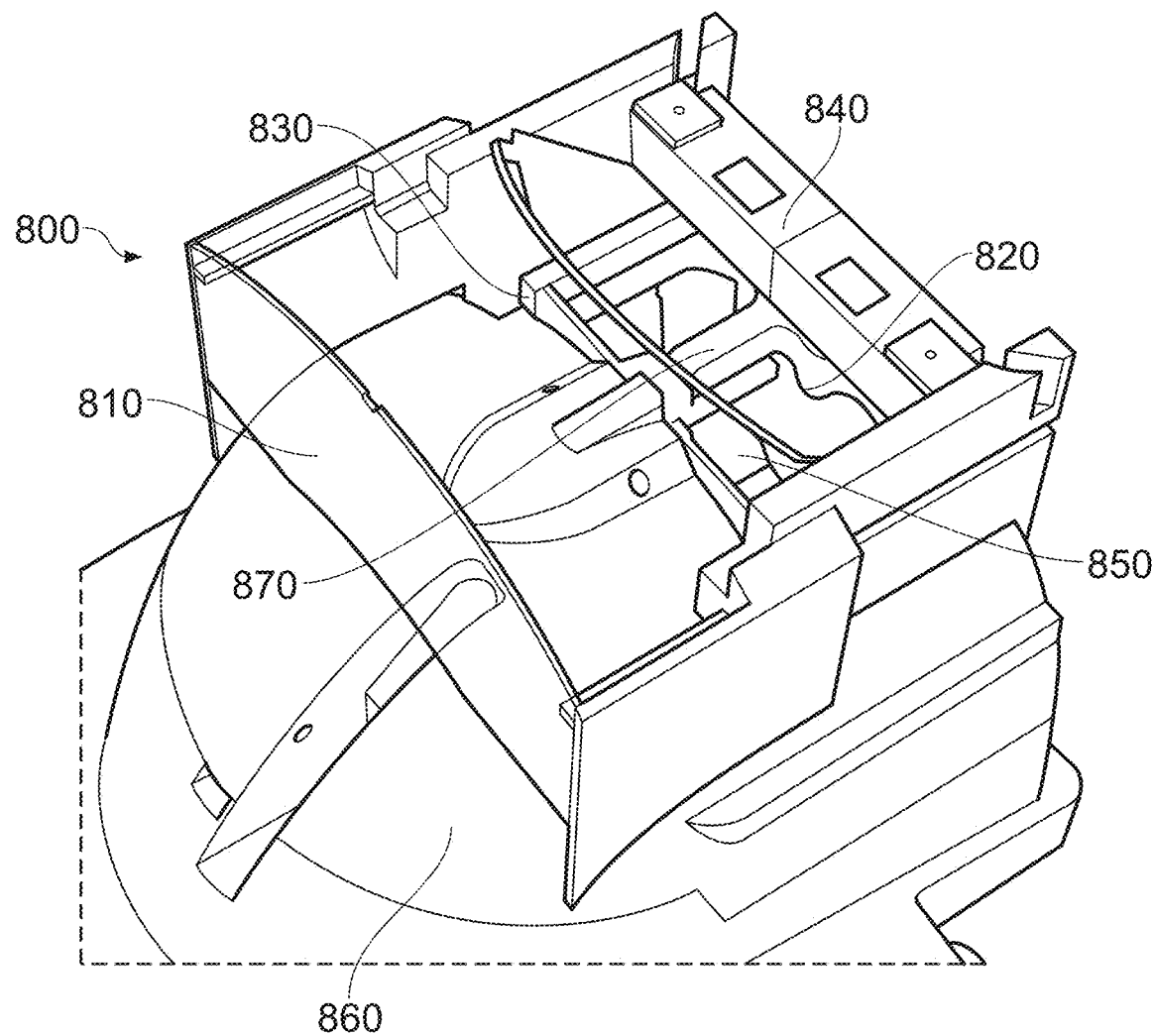
FIG. 8 is an isometric representation of some of the main components forming an internal structure of user equipment such as that shown in FIG. 7.

FIG. 8 is an isometric representation of some of the main components forming an internal structure of user equipment such as that shown in FIG. 7. The user equipment 800 shown is located on an MRI scanner headset 860. The user equipment is located over subject eye openings 850 so that the visual input offered to a subject can be controlled. In the example shown, a VR system is configured to project images through screen diffuser 810 towards viewing mirror 820 which directs the light towards a subject located within the headset 870. The user equipment 800 includes a barrier 870 which occludes viewing angle of each eye of a subject located within the headset 860 and allows control over visual input from the system to each eye of a subject. Such eye by eye visual control can be particularly useful when using anaglyph techniques, since appropriate filters and/or lenses for each eye can be placed in holder 830. The user equipment 800 includes a holder 840 in which a camera or other sensor can be placed to enable monitoring of subject eye movement through eye openings 850.

References

[1] Kazemi, Vahid, and Josephine Sullivan. "One millisecond face alignment with an ensemble of regression trees." Proceedings of the IEEE Conference on Computer Vision and Pattern Recognition. 2014.

[2] Tobii Technology (2015), "Tobii Accuracy and Precision Test Method for Remote Eye Trackers," https://stemedhub.org/resources/3310.

[3] Bohil, Corey J., Bradly Alicea, and Frank A. Biocca. "Virtual reality in neuroscience research and therapy." Nature reviews neuroscience 12.12 (2011): 752.

The invention claimed is:

1. An MRI scanner-compatible virtual reality system comprising:
   user equipment locatable within an MRI scanner bore, said user equipment being configured to provide a subject with an immersive virtual environment; said system further comprising:
   at least one sensor configured to track eye movement of said subject;
   wherein interaction of said subject with said immersive virtual environment is controlled by said tracked eye movement wherein said system is configured to provide the subject with an interactive gaze target which changes or evolves whilst gaze of said subject is determined to remain in contact with said gaze target, to provide subject feedback and improve overall subject engagement.

2. A system according to claim 1, wherein elements of said user equipment are constructed from materials which do not influence a magnetic field within said MRI scanner bore.

3. A system according to claim 1, wherein elements of said VR systems which are magnetically or electrically disruptive are located outside said scanner bore.

4. A system according to claim 1, wherein visual input for provision of said immersive virtual environment is relayed to said subject from outside the scanner bore via an optical system including a projector and one or more mirrors.

5. A system according to claim 1, wherein said at least one sensor configured to track eye movement of said subject comprises at least one camera forming part of said user equipment, and wherein said cameras are located on said user equipment a distance from a subject placed in said user equipment selected to mitigate electromagnetic interference in an MRI image captured by use of said scanner bore.

6. A system according to claim 1, wherein a processing device required to create said virtual reality environment is located outside said scanner bore.

7. A system according to claim 1, wherein said user equipment is dimensioned to fit within said scanner bore.

8. A system according to claim 1, wherein one or more elements of said virtual reality system is removably decouplable from said MRI scanner.

9. A system according to claim 1, wherein interaction of said subject with said immersive virtual environment is primarily controlled by said tracked eye movement.

10. A system according to any preceding claim 1, wherein said user equipment comprises one or more limiters, located within said user equipment, to restrict head movement of said subject.

11. A system according to claim 1, wherein said tracked eye movement comprises: gaze estimation achieved via pupil tracking.

12. A system according to claim 1, wherein said tracked eye movement comprises: deformable eye shape tracking.

13. A system according to claim 1, wherein said tracked eye movement comprises: pupil tracking including head pose compensation.

14. A system according to claim 1, wherein said tracked eye movement comprises: determining, from images obtained by said sensors, subject head movement and wherein said system is configured to use said determined head movement to correct or compensate MRI images obtained by said MRI scanner.

15. A system according to claim 1, wherein changes in subject head pose are estimated based on displacements of eye corners determined from one or more images of said subject's eye captured by said sensors, and wherein said changes are used to provide motion compensation.

16. A system according to claim 1, wherein said immersive virtual environment is concordant with a physical environment experienced by said subject.

17. A system according to claim 1, wherein said user equipment includes sound sensors configured to provide an input to said system such that an aural landscape forming part of said virtual environment includes main elements of an aural landscape within said scanner bore.

18. A system according to claim 1, wherein said user equipment includes one or more motion sensors configured to provide an input to said system such that a visual landscape forming part of said virtual environment is concordant with motion experienced by a subject within said scanner bore.

19. A system according to claim 1, wherein said system comprises: sound and image sensors configured to provide said system with information about a party located outside said scanner bore and to insert said party into said virtual environment to interact with said subject.

* * * * *